(12) United States Patent
Millard et al.

(10) Patent No.: US 8,231,390 B2
(45) Date of Patent: Jul. 31, 2012

(54) SYSTEM AND METHOD FOR CONTROLLING IMPEDANCE IN A FLEXIBLE CIRCUIT

(75) Inventors: Steven J. Millard, Mechanicsburg, PA (US); Dustin G. Rowe, Harrisburg, PA (US); Bruce A. Champion, Lemoyne, PA (US); Justin A. Pickel, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 118 days.

(21) Appl. No.: 12/818,770

(22) Filed: Jun. 18, 2010

(65) Prior Publication Data

US 2011/0312196 A1 Dec. 22, 2011

(51) Int. Cl.
*H01R 12/00* (2006.01)
(52) U.S. Cl. ............................. 439/67; 439/77
(58) Field of Classification Search .............. 439/62, 439/67, 77, 943
See application file for complete search history.

(56) References Cited

U.S. PATENT DOCUMENTS

| | | | |
|---|---|---|---|
| 4,528,530 A * | 7/1985 | Ketchen | 333/246 |
| 4,552,420 A | 11/1985 | Eigenbrode | |
| 5,044,980 A * | 9/1991 | Krumme et al. | 439/496 |
| 5,316,787 A * | 5/1994 | Frankeny et al. | 216/19 |
| 5,648,892 A * | 7/1997 | Wieloch et al. | 361/788 |
| 5,919,546 A * | 7/1999 | Horiuchi et al. | 428/131 |
| 6,040,624 A * | 3/2000 | Chambers et al. | 257/692 |
| 6,123,551 A * | 9/2000 | Westfall | 439/67 |
| 7,435,101 B2 * | 10/2008 | Yoneta et al. | 439/67 |
| 7,606,041 B2 * | 10/2009 | Park | 361/749 |
| 7,758,964 B2 * | 7/2010 | Lu et al. | 428/423.1 |
| 7,789,669 B1 * | 9/2010 | Duesterhoeft et al. | 439/65 |
| 7,794,233 B1 * | 9/2010 | Millard et al. | 439/65 |

\* cited by examiner

*Primary Examiner* — Thanh Tam Le

(57) ABSTRACT

A flexible circuit is provided. The flexible circuit includes a circuit board mating end and a flexible body extending from the circuit board mating end. A conductive pathway extends through the flexible body to electrically couple circuit boards. A connector pad is positioned on the circuit board mating end. The conductive pathway electrically engages the connector pad. The connector pad is configured to electrically couple the flexible circuit to one of the circuit boards. A layer of uncured material extends between the connector pad and the conductive pathway. The layer of uncured material increases an impedance of the connector pad.

20 Claims, 5 Drawing Sheets

SYSTEM AND METHOD FOR CONTROLLING IMPEDANCE IN A FLEXIBLE CIRCUIT

BACKGROUND OF THE INVENTION

The subject matter herein relates generally to flexible circuits, and more particularly, to a system and method for controlling impedance in a flexible circuit.

Some electrical systems, such as servers, routers, and data storage systems, utilize connector assemblies for transmitting signals and/or power through the electrical system. Such connector assemblies typically include a backplane or a midplane circuit board, a motherboard, and a plurality of daughter cards. The connector assemblies also include one or more electrical connectors that are attached to the circuit board for interconnecting the daughter cards to the circuit board when the daughter card is inserted into the electrical system. A flexible circuit is electrically coupled to the daughter cards and the circuit board to transfer power and data signals therebetween. The flexible circuit includes a flexible substrate and at least one conductive pathway extending through the substrate. Generally. the conductive pathway is formed from thin copper. The flexible circuit includes connector pads that couple the conductive pathways to contacts on a midplane circuit board, a motherboard, and/or a daughter card. The connector pads are in electrical contact with the conductive pathway to form an electrical transmission path through the flexible circuit.

However, the connector pads and the conductive pathway may experience crosstalk. In particular. the conductive pathway generates electromagnetic fields that radiate outward from the conductive pathway. If the connector pads are positioned too close to the conductive pathway, an impedance of the connector pad may be reduced. Low impedance in the connector pad subjects the connector pad to interference from the electromagnetic fields generated by the conductive pathway. When the conductive pathway is operating at a high data rate that generates stronger electromagnetic fields, it becomes difficult to maintain consistent impedance through the connector pads. To improve the impedance of the connector pads, the connector pads are generally separated from the conductive pathway with cured dielectric materials. The electromagnetic field is weaker at locations further from the conductive pathway. The dielectric material separates the connector pads and the conductive pathway to position the connector pad in a location where the electromagnetic field is weaker.

However, cured dielectrics are typically either very thin and/or very expensive. A thin dielectric may not separate the connector pad and the conductive pathway a sufficient distance to properly maintain the impedance of the connector pad. The cost of the uncured dielectric is also proportional to a thickness of the dielectric. Accordingly, thicker uncured dielectrics are generally more expensive. As such, providing sufficient separation between the connector pad and the conductive pathway may not be cost effective.

Accordingly, there is a need for a low cost solution to maintain the impedance of a connector pad in flexible circuit.

SUMMARY OF THE INVENTION

In one embodiment, a flexible circuit is provided. The flexible circuit includes a circuit board mating end and a flexible body extending from the circuit board mating end. A conductive pathway extends through the flexible body to electrically couple circuit boards. A connector pad is positioned on the circuit board mating end. The conductive pathway electrically engages the connector pad. The connector pad is configured to electrically couple the flexible circuit to one of the circuit boards. A layer of uncured material extends between the connector pad and the conductive pathway. The layer of uncured material increases an impedance of the connector pad.

In another embodiment, a removable card connector assembly is provided. The assembly includes a circuit board and a connector coupled to the circuit board and configured to couple the assembly to another circuit board. A flexible circuit is provided to electrically join the circuit boards. The flexible circuit includes a circuit board mating end and a flexible body extending from the circuit board mating end. A conductive pathway extends through the flexible body to electrically couple the circuit boards. A connector pad is positioned on the circuit board mating end. The conductive pathway electrically engages the connector pad. The connector pad is configured to electrically couple the flexible circuit to one of the circuit boards. A layer of uncured material extends between the connector pad and the conductive pathway. The uncured material increases a distance between the connector pad and the conductive pathway.

In another embodiment, a flexible circuit is provided. The flexible circuit includes circuit board mating ends and a flexible body extending between the circuit board mating ends. Each of the circuit board mating ends is configured to electrically couple to a circuit board. Transmission paths extend through the flexible circuit to transmit signals between the circuit boards. A layer of uncured material extends between the transmission paths. The uncured material increases an impedance of the transmission paths.

DETAILED DESCRIPTION OF THE DRAWINGS

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
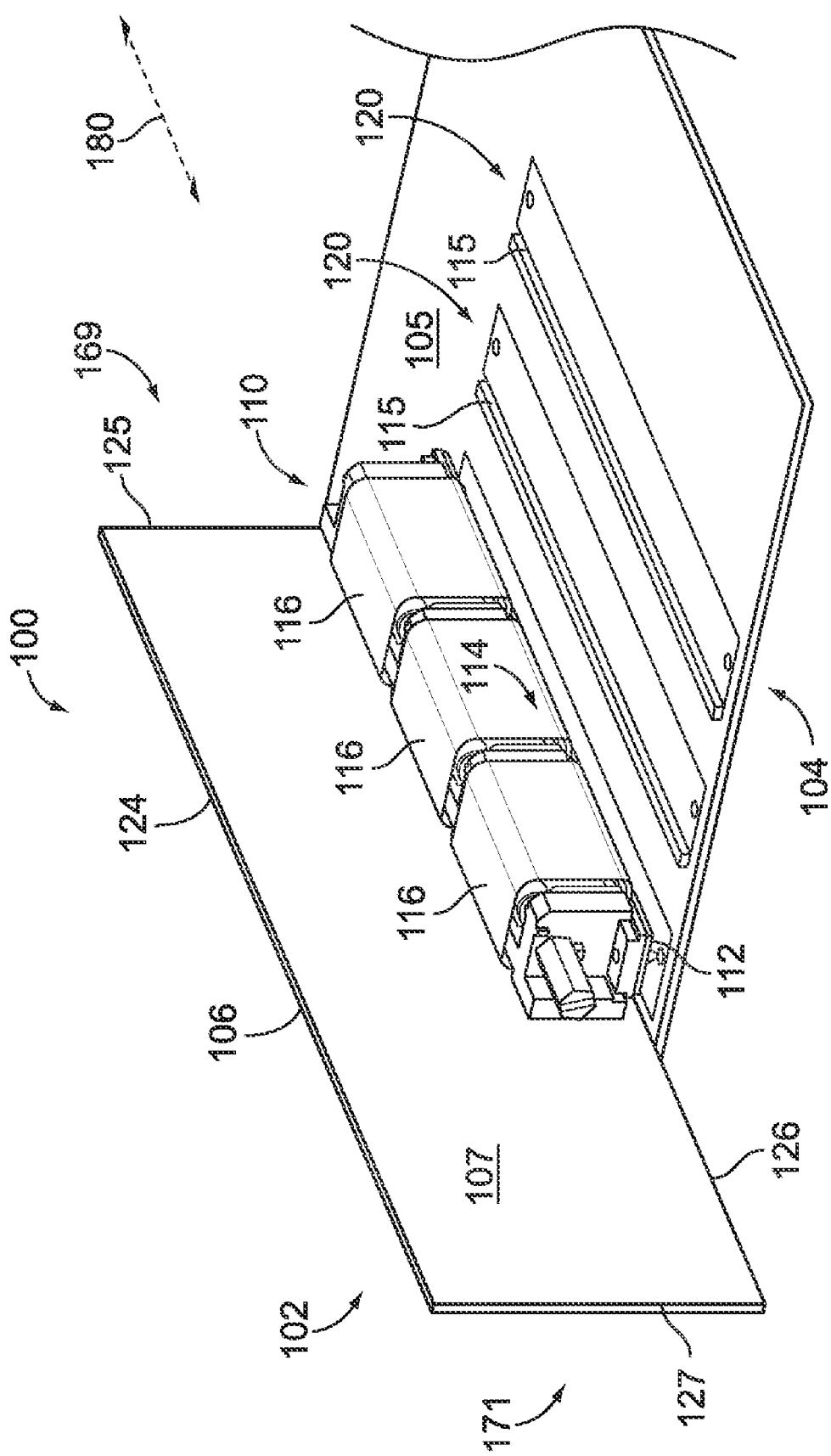
FIG. 1 is a perspective view of an electrical connector formed in accordance with an embodiment.

FIG. 1 is a perspective view of an electrical system 100 formed in accordance with one embodiment that includes a removable card connector assembly 102 and a primary circuit board 104. The card connector assembly 102 includes a secondary circuit board 106 having a surface 107 and an electrical connector assembly 110 that is coupled to the surface 107 of the secondary circuit board 106. The card connector assembly 102 has a leading end 169 and a trailing end 171, and the secondary circuit board 106 is defined by side edges 124, 125, 126, and 127. The electrical connector assembly 110 is configured to be removably coupled to a system contact array 120 of mating contacts along a surface 105 of the primary circuit board 104. As one example for the electrical system 100, the card connector assembly 102 may be a part of a server blade and the primary circuit board 104 may be a mother board of a server system. However, the electrical system 100 shown in FIG. 1 may be a variety of other electrical systems, such as a router system or data storage system.

The electrical connector assembly 110 includes a circuit assembly 114 having a mating side 112 and one or more flexible circuits 116. The circuit assembly 114 communicatively couples the primary and secondary circuit boards 104 and 106 by providing conductive paths therebetween. The mating side 112 may also include one or more moveable contact arrays that are configured to be moved toward and away from the contact array 120 of mating contacts on the primary circuit board 104.

When the card connector assembly 102 and the primary circuit board 104 are to be engaged, the card connector assembly 102 may be advanced along the surface 105 in a longitudinal mating direction (i.e., along a longitudinal axis 180). For example, the card connector assembly 102 may slidably engage guiding features 115, which are illustrated as rails in FIG. 1, and slide to a predetermined position and orientation with respect to the contact array 120. Once the card connector assembly 102 is properly positioned alongside the contact array 120, the mating side 112 may be moved to engage the contact array.

Figure 2:
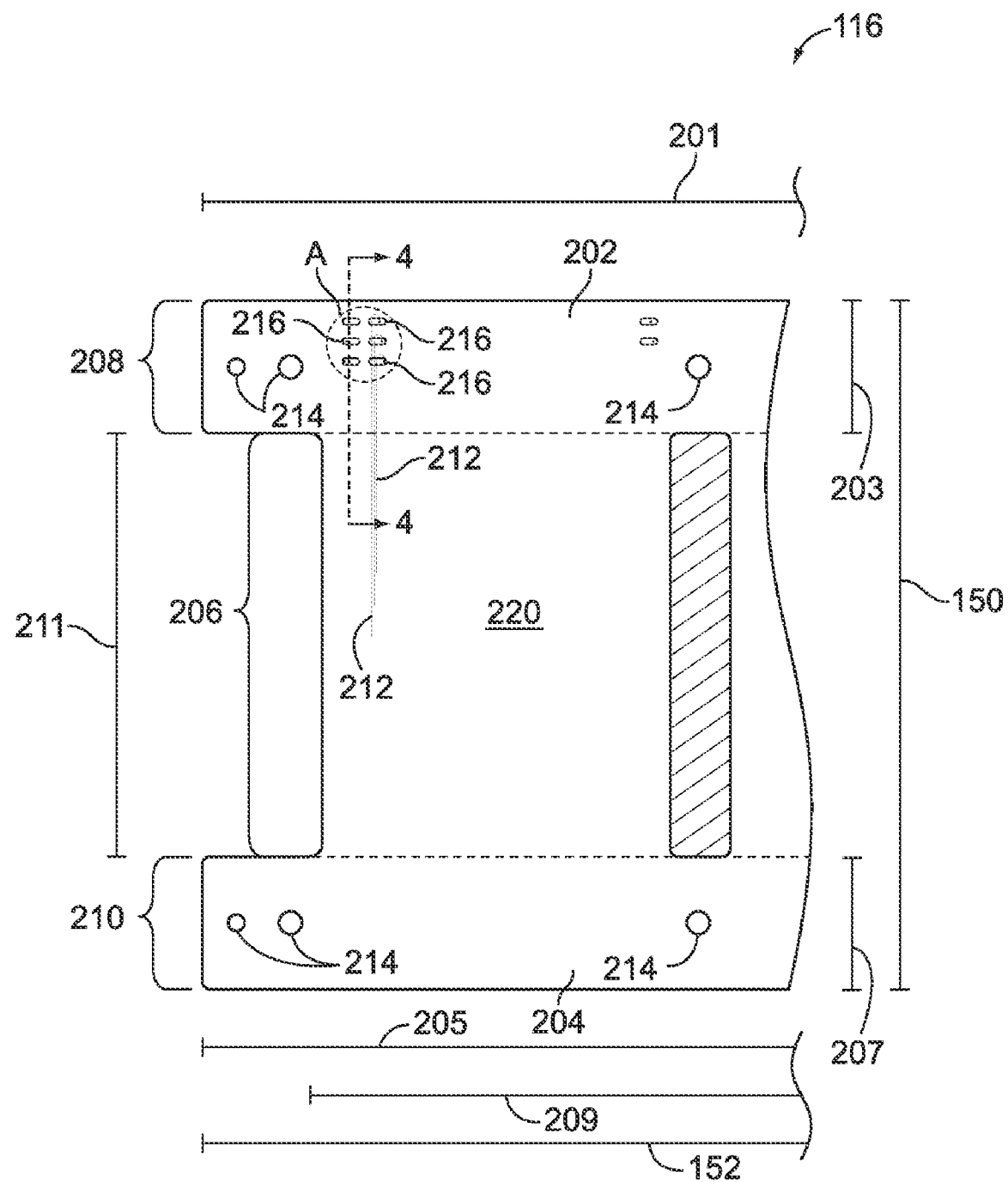
FIG. 2 is a plan schematic view of a flexible circuit that may be used with the connector shown in FIG. 1.

FIG. 2 is a plan view of the flexible circuit 116. FIG. 2 illustrates the flexible circuit 116 in a flat configuration. The flexible circuit 116 has a length 150 and a width 152. The flexible circuit 116 includes a pair of circuit board mating ends 202 and 204. The circuit board mating ends 202 and 204 are formed from a rigid material and are configured to be coupled to one of the circuit boards 104, 106. The circuit board mating end 202 has a width 201 and a length 203. The circuit board mating end 204 has a width 205 and a length 207. The circuit board mating ends 202, 204 may have the same width 201, 205 and/or length 203, 207. Optionally, the circuit board mating ends 202, 204 may have different widths 201, 205 and/or lengths 203, 207. A flexible body 206 extends between the circuit board mating ends 202 and 204. The flexible body 206 has a width 209 and a length 211. The flexible body 206 may be formed from a flexible polymer film, for example polyester, polyimide, polyethylene napthalate, and/or polyetherimide. A thickness of the flexible body 206 is proportional to a flexibility of the flexible body 206. The circuit board mating end 202 includes an interface 208 that is configured to be coupled to a circuit board, for example primary circuit board 104. The circuit board mating end 204 includes an interface 210 that is configured to be coupled to another circuit board, for example secondary circuit board 106.

The interfaces 208 and 210 may be configured to be inserted into a slot of the circuit board 104, 106 and/or include contacts that are through-hole mounted to the circuit board 104, 106. Optionally, the interfaces 208 and 210 may include vias to receive contacts extending from the circuit board 104, 106. In another embodiment, the interfaces 208 and 210 may include pads that are soldered and/or otherwise mechanically coupled to the circuit board 104, 106 or the circuit board 104, 106 may include pads to which the interfaces 208 and 210 are mechanically coupled. In the illustrated embodiment, the interfaces 208 and 210 include apertures 214. The apertures 214 are configured to receive a tab and/or pin of the circuit board 104, 106 to mechanically couple the flexible circuit 116 to the circuit board 104, 106.

Conductive pathways 212 extend through the flexible body 206. The conductive pathways 212 are formed from a metal foil, for example copper. Alternatively, the conductive pathways 212 may be formed from any suitable conductive material. The conductive pathways 212 form an electrical transmission path across the flexible circuit 116 between the circuit boards 104, 106. The conductive pathways 212 may be power traces that carry power across the flexible circuit 116 between the circuit boards 104 and 106. Optionally, the conductive pathways 212 may be signal traces that carry data signals between the circuit boards 104 and 106. Alternatively, the conductive pathways 212 may be a combination of power traces and signal traces. In one embodiment, the conductive pathways 212 are embedded within the flexible body 206. Alternatively, the conductive pathways 212 may extend along a surface 220 of the flexible circuit 116. A protective covering may extend over the flexible circuit 116 to protect the conductive pathways 212 extending there along.

In the illustrated embodiment, the interfaces 208, 210 include connector pads 216 positioned thereon. The connector pads 216 are formed from an electrically conductive material, for example copper. Each conductive pathway 212 is electrically joined to a connector pad 216. The conductive pathways 212 are also mechanically coupled to the connector pad 216. The conductive pathways 212 may be soldered to the connector pad 216. Alternatively, the connector pads 216 include a via. The conductive pathways 212 may be joined to the connector pad 216 through an interference fit with the via. The connector pads 216 electrically engage a circuit board 104, 106 to form an electrical transmission path that transmits power and/or data signals between the flexible circuit 116 and the circuit board 104, 106.

The interfaces 208, 210 are configured to engage the circuit board 104, 106 so that the connector pads 216 are positioned in contact with connector pads on the circuit board 104, 106. The connector pads 216 are soldered to the connector pads on the circuit board 104, 106 to form an electrical connection between the interface 208, 210 and the circuit board 104, 106. Optionally, the connector pads 216 may include vias that receive a pin of the circuit board 104, 106.

Figure 3:
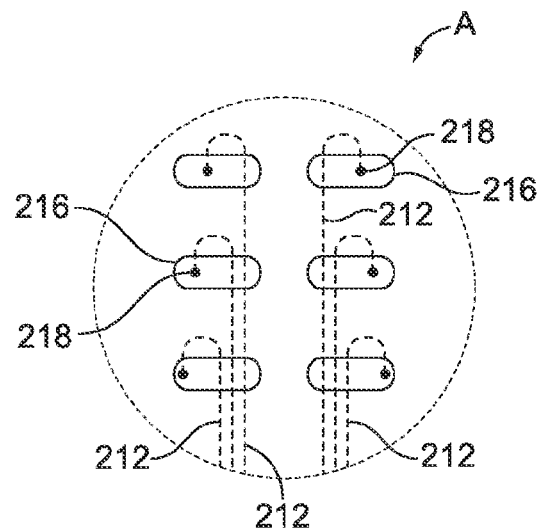
FIG. 3 is an expanded view of the connector pads within area A of FIG. 2.

FIG. 3 is an expanded view of the connector pads 216 within the area A, shown in FIG. 2. The conductive pathways 212 are joined to an electrical contact 218 that is positioned on an end of the conductive pathway 212. The electrical contacts 218 are soldered to the individual connector pads 216 to form a portion of the electrical transmission path between the flexible circuit 116 and the circuit boards 104, 106. Each connector pad 216 receives an electrical contact 218 thereon. However, the number of connector pads 216 utilized is dependent on the number of conductive pathways 212. Some connector pads 216 may be unused.

In one embodiment, the connector pads 216 are formed as vias having conductive metal plating therein. The electrical contact 218 of the conductive pathway 212 is positioned within the connector pad 216. The circuit board 104, 106 includes metal contacts that are configured to be received within the connector pad 216. The interface 208, 210 is positioned flush against the circuit board 104, 106 so that the metal contacts of the circuit board 104, 106 are inserted into the connector pad 216. The electrical contact 218 is secured within the connector pad 216 through an interference fit between the connector pad 216 and the metal contacts of the circuit board 104, 106. The interference fit creates an electrical coupling between the conductive pathway 212 and the circuit board 104, 106, thereby electrically joining the flexible circuit 116 and the circuit board 104, 106.

Figure 4:
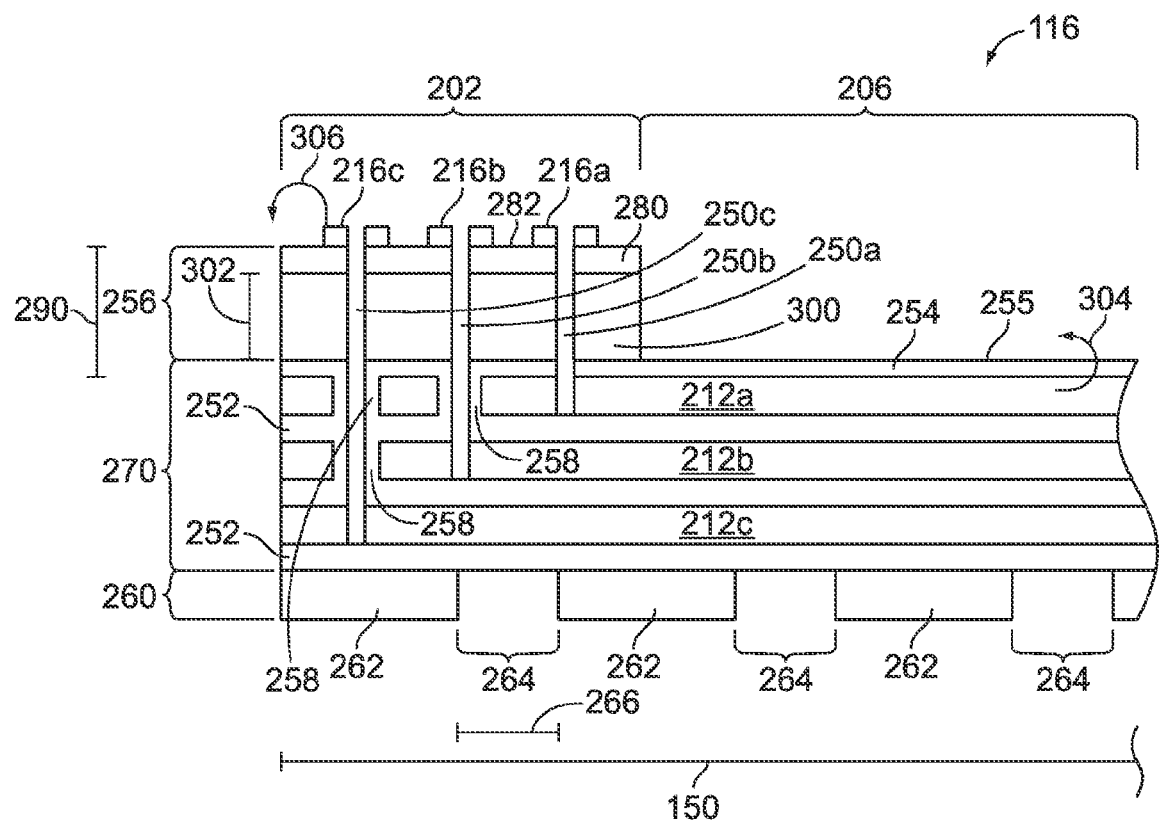
FIG. 4 is a cross-sectional view of the flexible circuit, shown in FIG. 2, taken at line 4 of FIG. 2.

FIG. 4 illustrates a cross-sectional view of the flexible circuit 116 taken at line 4 of FIG. 2. FIG. 4 illustrates the circuit board mating end 202 and a portion of the flexible body 206. It should be noted that the components of the circuit board mating end 204 may be similar to the components of the circuit board mating end 202. The flexible circuit 116 includes a base 260 formed from a rigid material. In an exemplary embodiment, the base 260 is a reinforced epoxy laminate, for example a woven fiberglass cloth with an epoxy resin. The base 260 may be FR-4 graded by the National Electrical Manufactures Association. The base 260 may also be flame resistant. In the illustrated embodiment, the base 260 does not extend the length 150 of the flexible circuit 116. The base 260 is divided into distinct and independent sections 262 along the length 150 of the flexible circuit 116. A gap 264 is provided between each section 262. The gaps 264 provide flexibility to the flexible circuit 116 without cracking and/or damaging the base 260. An amount of flexibility in the flexible circuit 116 may depend on a width 266 of each gap 264.

A flexible circuit substrate 270 extends along the base 260. The substrate 270 includes the conductive pathways 212 and layers of insulation 252. The insulation 252 may include a polyimide material having a high heat and chemical resistance. For example, the insulation 252 may be any one of Apical, Kapton, UPILEX, VTEC PI, Norton TH, Kaptrex, or a combination thereof. The insulation 252 reduces an amount of heat conducted by the conductive pathways 212. The insulation 252 also separates the conductive pathways 212 to reduce cross-talk therebetween. The insulation 252 may have a relative dielectric constant of approximately 3.4. A layer of insulation 254 forms a top surface 255 of the flexible body 206.

A dielectric layer 256 extends along the layer of insulation 254. The dielectric layer 256 forms a part of the circuit board mating end 202. A layer of insulation 280 forms a top surface 282 of the dielectric layer 256. The connector pads 216 are surface mounted on the top surface 282 of the dielectric layer 256. The connector pads 216 may be soldered to the layer of insulation 280 and/or joined to the layer of insulation 280 by an adhesive. Alternatively, the connector pads 216 may be joined to the layer of insulation 280 using any suitable mechanical coupling mechanism. Each of the layers and components described herein may be coupled by layers of adhesive.

The illustrated embodiment shows three connector pads 216(a), 216(b), and 216(c) and three conductive pathways 212(a), 212(b), and 212(c). The connector pads 216 electrically engage the conductive pathways 212 through vias 250 extending through the flexible circuit 116. The conductive pathways 212(a), 212(b), and 212(c) are joined to the connector pads 216(a), 216(b), and 216(c) through a respective via 250(a), 250(b), and 250(c). The vias 250 are plated with a conductive material, for example, copper. The conductive material transmits signals and power between the conductive pathways 212 and the connector pads 216. Each connector pad 216 is joined to a corresponding conductive pathway 212. In an embodiment having power traces through the conductive pathways 212, each conductive pathway 212 may be electrically joined to a single connector pad 216.

The conductive pathways 212 may include apertures 258 that circumvent a via 250 to prohibit electrical engagement between the conductive pathway 212 and the via 250. For example, the conductive pathway 212(a) includes apertures 258 that circumvent the vias 250(b) and 250(c). The conductive pathway 212(b) includes an aperture 258 that circumvents the via 250(c). The apertures 258 are filled with insulation 252 to insulate the corresponding via 250 from the conductive pathway 212.

The dielectric layer 256 includes a layer of uncured material 300 coupled between the insulation 254 and the insulation 280. The uncured material 300 may be a pre-preg material that has not been hardened by a curing process. The uncured material 300 may include reinforcement fibers or fabrics filled with a pre-catalyzed resin system. The reinforcement fibers may take the form of a weave or a uni-directional fiber. For example, the uncured material 300 may be a glass weave filled with an epoxy. The uncured material 300 may be FR-4 graded by the National Electrical Manufactures Association and may be flame resistant. In an exemplary embodiment, the uncured material 300 may have relative dielectric constant between 3.9 and 4.2. The uncured material 300 may have a thickness 302 of approximately 150 microns. During the final stages of assembling of the flexible circuit 116, the flexible circuit 116 is pressed and heated to bond the layers of the flexible circuit 116. When the flexible circuit 116 is heated, the layer of uncured material 300 is cured to form a hardened layer.

The layer of uncured material 300 extends the width 201 and the length 203 of the circuit board mating end 202. Alternatively, the uncured material 300 may extend only a portion of the width 201 and/or the length 203 of the circuit board mating end 202. Insulation 252 may fill portions of the circuit board mating end 202 that do not include a layer of the uncured material 300. The uncured material 300 may also extend along a portion of or the entire length of the top surface 255 of the flexible body 206. In another embodiment, the uncured material 300 is embedded within the flexible circuit substrate 270. The uncured material 300 may extend between adjacent conductive pathways 212. The uncured material 300 may extend a portion of, or the entire length 150 and/or width 152 of, the flexible circuit 116. Insulation 252 may fill portions of the flexible circuit substrate 270 that do not include a layer of the uncured material 300.

The thickness 302 of the uncured material 300 increases a distance 290 between the conductive pathways 212, for example conductive pathway 212(a), and the connector pads 216. In an embodiment having uncured material 300 positioned between conductive pathways 212, the thickness 302 of the uncured material 300 may increase a distance between the conductive pathways 212. The conductive pathways 212 generate electromagnetic fields 304 that radiate outward from the conductive pathway 212. A strength of the field 304 decreases as the field moves further from the conductive pathway 212. The impedance of the connector pads 216 is proportional to the distance 290 between the conductive pathways 212 and the connector pads 216. Increasing the distance 290 between the conductive pathways 212 and the connector pads 216 increases the impedance of the connector pads 216 by positioning the connector pads 216 in an area where the electromagnetic fields 304 are weaker. Weaker electromagnetic fields 304 generate less interference and cross-talk between the conductive pathways 212 and the connector pads 216. Increasing the thickness 302 of the uncured material 300 increases the distance 290 between the conductive pathways 212 and the connector pads 216. The thickness 302 of the uncured material 300 may be selected based on a required impedance of the connector pads 216 and the conductive pathways 212.

The connector pads 216 also generate electromagnetic fields 306. The electromagnetic fields 306 may interfere with the conductive pathways 212. The distance 290 also increases an impedance of the conductive pathways 212. The increased impedance decreases an amount of cross-talk and interference from the connector pads 216 that is experienced by the conductive pathways 212. Alternatively, in an embodiment having a layer of uncured material 300 embedded between conductive pathways 212, the thickness 302 of the uncured material increases an impedance of each conductive pathway 212, thereby reducing interference and cross-talk between the conductive pathways 212.

Impedance is inversely proportional to capacitance. Increasing the impedance of the connector pads 216 may also reduce a capacitance of the connector pads 216. A reduced capacitance increases the ability of the connector pads 216 and the conductive pathways 212 to transmit signals and/or power. The reduced capacitance creates high speed transmission paths through the connector pads 216 and the conductive pathways 212.

The layer of uncured material 300 may be positioned at any location between the conductive pathways 212 and the connector pads 216. In one embodiment, the flexible circuit 116 does not include the layers of insulation 252. The layer of uncured material 300 may be positioned directly between, and adjacent to, a conductive pathway 212 and/or a connector pad 216. Alternatively, any number of layers, including adhesive, insulation, and/or uncured material, may be positioned between the conductive pathways 212 and the connector pads 216.

Figure 5:
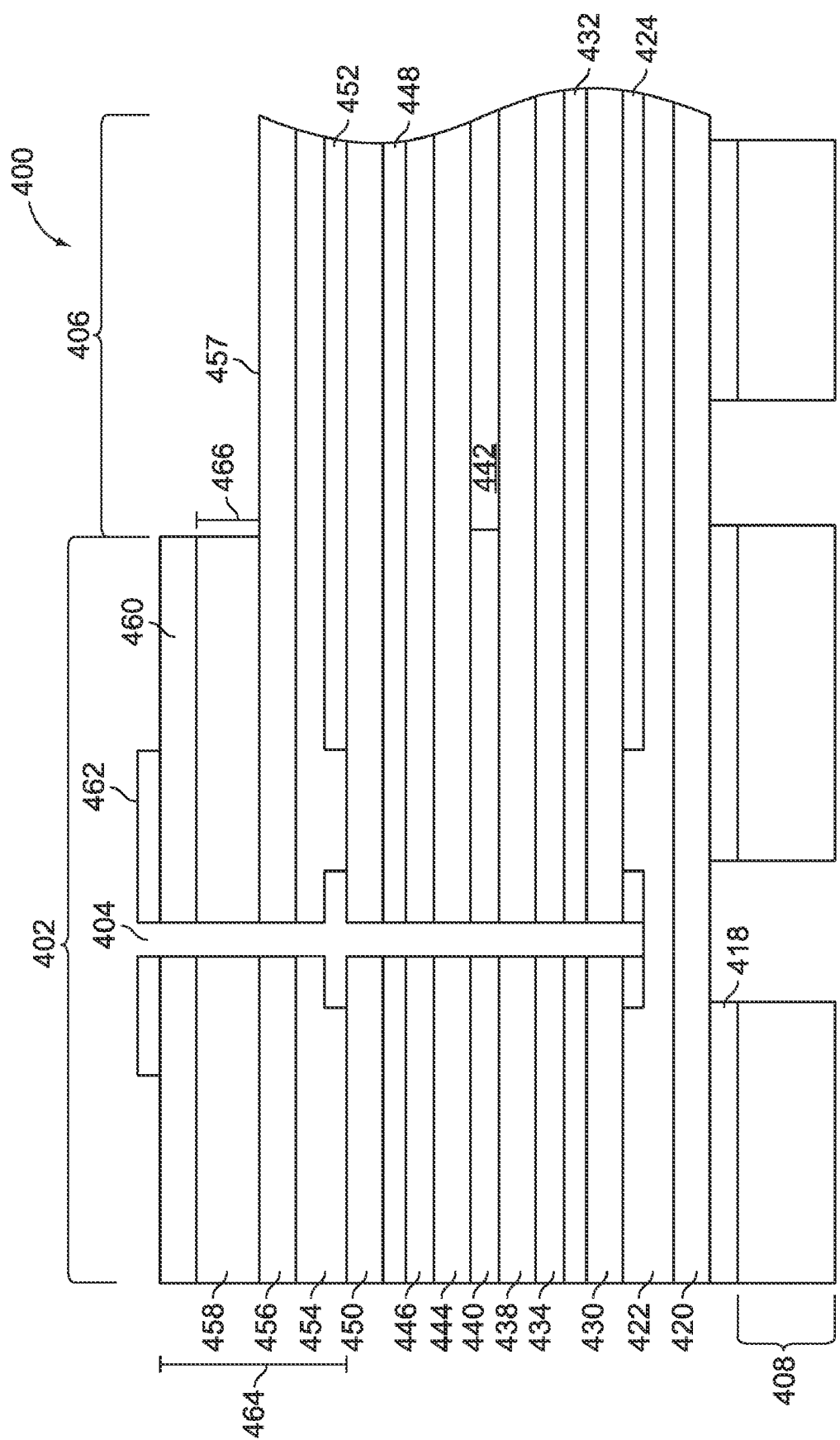
FIG. 5 is a side cross-sectional view of another flexible circuit formed in accordance with an embodiment.

FIG. 5 is a side cross-sectional view of another flexible circuit 400. The flexible circuit 400 includes a circuit board mating end 402. The circuit board mating end 402 is formed from a rigid material and is configured to be joined to a circuit board 104, 106. The circuit board mating end 402 includes a via 404 extending therethrough. A flexible body 406 extends from the circuit board mating end 402. In an exemplary embodiment, the flexible circuit 400 has an approximate total thickness of 1007 microns and the flexible body 406 has an approximate total thickness of 397 microns. The flexible circuit 400 also includes a base 408 formed from a rigid material. As defined herein, the flexible body 406 does not include the base 408. In an exemplary embodiment, a thickness of the base 408 is approximately 350 microns. An adhesive layer 418 is provided on the base 408. The adhesive layer 418 may have an approximate thickness of 25 microns. A layer of insulation 420 extends over the adhesive layer 418. The insulation 420 has another layer of adhesive 422 coupled thereto. In an example embodiment, the layer of insulation 420 and the layer of adhesive 422 have a combined thickness of approximately 50 microns.

A conductive pathway 424 is embedded within the adhesive layer 422. The conductive pathway 424 may have a thickness of approximately 18 microns. The layer of insulation 420 and the layer of adhesive 422 may have combined thickness of approximately 32 microns in the areas of the adhesive layer 422 in which the conductive pathway 424 is embedded. A layer of insulation 430 extends over the conductive pathway 424 and portions of the adhesive layer 422. The layer of insulation 430 may have a thickness of approximately 50 microns.

An electrical ground 432 extends along the insulation 430. In an example embodiment, the electrical ground 432 may have an approximate thickness of 18 microns. A layer of adhesive 434 extends along the electrical ground 432. Another layer of insulation 438 is coupled to the adhesive 434. The adhesive 434 and the insulation 438 have a combined thickness of approximately 32 microns.

At the circuit board mating end 402 a layer of bond adhesive 440 is joined to the insulation 438. A void 442 is provided through the flexible body 406 adjacent to the layer of bond adhesive 440. The void 442 provides flexibility to the flexible circuit 400. In another embodiment, the flexible circuit 400 may not include the void 442, but rather the bond adhesive 440 may extend a length of the flexible circuit 400. In an example embodiment, the layer of bond adhesive 440 and the void 442 may have an approximate thickness of 25 microns.

A layer of insulation 444 is coupled to the bond adhesive 440 and extends a length of the flexible circuit 400. A layer of adhesive 446 extends along the insulation 444. An electrical ground 448 is embedded within the adhesive 446. The electrical ground may have a thickness of approximately 18 microns. The insulation 444 and the adhesive 446 may have a combined approximate thickness of 32 microns.

A layer of insulation 450 is provided that may have a thickness of approximately 50 microns. A conductive pathway 452 extends along the layer of insulation 450. A layer of adhesive 454 is provided, so that the conductive pathway 452 is embedded within the adhesive 454. Another layer of insulation 456 extends along the adhesive 454. In an example embodiment, the conductive pathway 452 has a thickness of approximately 18 microns. In portions of the flexible circuit 400 in which the conductive pathway 452 is not embedded within the adhesive 454, the insulation 456 and the adhesive 454 may have a combined approximate thickness of 50 microns. In portions of the flexible circuit 400 in which the conductive pathway 452 is embedded within the adhesive 454, the insulation 456 and the adhesive 454 may have a combined approximate thickness of 32 microns. The insulation 456 provides a top surface 457 of the flexible body 406.

The circuit board mating end 402 includes a layer of uncured material 458 coupled to the layer of insulation 456. The uncured material 458 may include reinforcement fibers or fabrics into which a pre-catalyzed resin system has been impregnated. The uncured material 458 may take the form of a weave or a uni-directional fiber. The uncured material 458 may be FR-4 graded by the National Electrical Manufactures Association. The uncured material 458 may be flame resistant. The uncured material 458 may have a thickness of approximately 150 microns. A layer of insulation 460 having an approximate thickness of 50 microns is positioned on the uncured material 458.

A connector pad 462 is positioned on the insulation 460. The connector pad 462 may be formed from copper and/or any suitable conductive material. The connector pad 462 is configured electrically engage a circuit board 104, 106. The connector pad 462 may have an approximate thickness of 35 microns. The connector pad 462 may be electrically joined to a conductive pathway 424, 452 and/or a electrical ground 432, 448. The electrical grounds 432, 448, conductive pathways 424, 452 and the connector pad 462 may form electrical transmission paths between circuit boards 104 and 106. Data and/or power signals are transmitted over the electrical transmission paths.

The layer of uncured material 458 increases a distance between the electrical grounds 432, 448 and conductive pathways 424, 452 and the connector pad 462 to increase an impedance of, and reduce a capacitance of, the connector pad 462. The layer of uncured material 458 may be positioned at any location between the electrical grounds 432, 448 and conductive pathways 424, 452 and the connector pad 462. In one embodiment, the flexible circuit 400 does not include the layers of insulation 456 and 460. The layer of uncured material 458 may be positioned directly between, and adjacent to, the conductive pathway 452 and the connector pads 462.

Alternatively, any number of layers may be positioned between the electrical grounds 432, 448, the conductive pathways 424, 452, and the connector pad 462.

Increasing the impedance of the connector pad 462 reduces an amount of interference from the electrical grounds 432, 448 and conductive pathways 424, 452. The impedance of the connector pad 462 is proportional to a distance between any one of the electrical grounds 432, 448 and conductive pathways 424, 452 and the connector pad 462, for example a distance 464 between the conductive pathway 452 and the connector pad 462. Increasing a thickness 466 of the uncured material 458 increases the distance 464. The thickness 466 of the uncured material 458 may be selected based on a required impedance of the connector pad 462.

Figure 6:
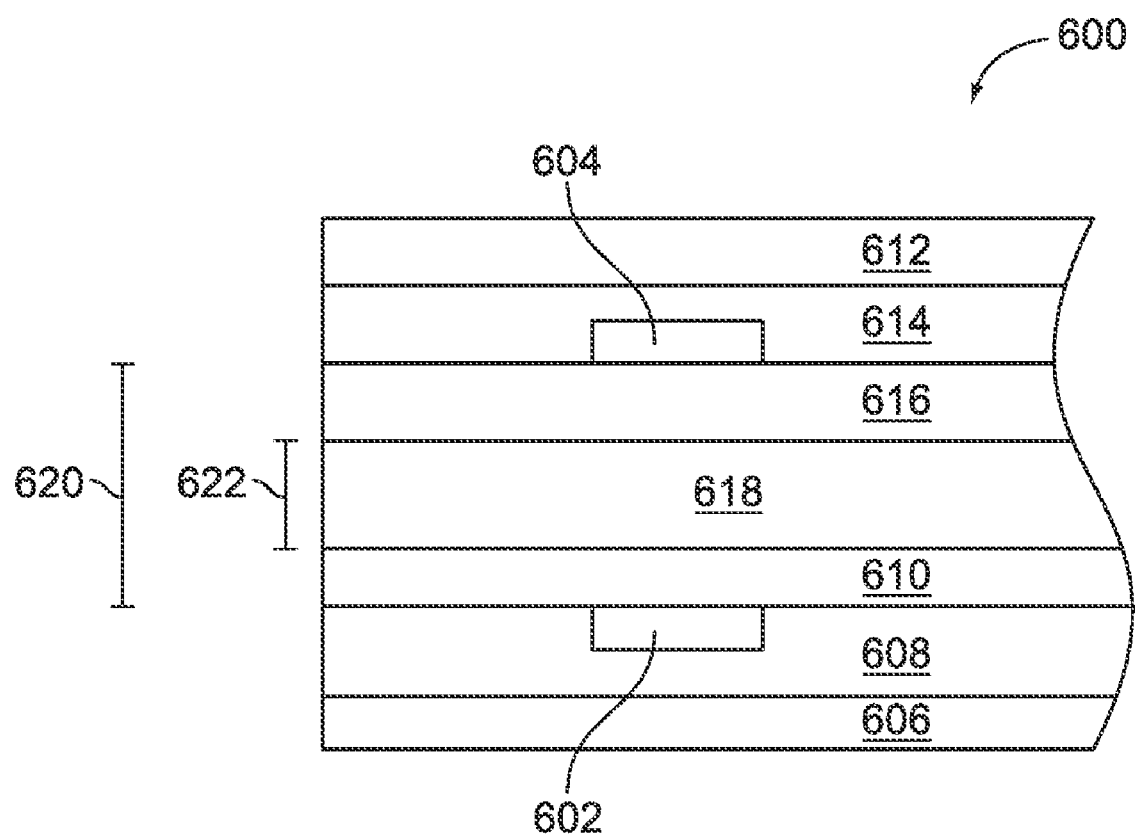
FIG. 6 is a side cross-sectional view of another flexible circuit formed in accordance with an embodiment.

FIG. 6 is a cross-sectional view of a flexible circuit 600. FIG. 6 may illustrate a flexible body and/or a circuit board mating end of the flexible circuit 600. The flexible circuit 600 is configured to couple to a circuit board 104, 106. The flexible circuit 600 includes a pair of conductive pathways 602 and 604. The conductive pathways 602, 604 may be formed from copper and/or any other suitable conductive material. The flexible circuit 600 may also include a connector pad (not shown) coupled to a circuit board mating end of the flexible circuit 600. The connector pad may be formed from copper and/or any other suitable conductive material. The conductive pathways 602, 604 form electrical transmission paths between a pair of circuit boards 104, 106. The flexible circuit 600 is configured to electrically engage one of the circuit boards 104, 106.

The flexible circuit 600 includes a layer of insulation 606. The layer of insulation 606 may extend along a rigid base extending a length of the flexible circuit 600. Alternatively, a rigid base may be divided into discrete sections positioned along the flexible circuit 600. The layer of insulation 606 extends across the sections of the rigid base for a length of the flexible circuit 600. The layer of insulation 606 may be a polyimide layer and/or a layer of any other suitable insulation material. The layer of insulation 606 reduces an amount of heat generated by the flexible circuit 600 and, in particular, the conductive pathways 602, 604. A layer of adhesive 608 extends along the insulation 606. The conductive pathway 602 is embedded within the layer of adhesive 608. Another layer of insulation 610 extends over the adhesive 608 and the conductive pathway 602.

The flexible circuit 600 includes another layer of insulation 612 that is configured to reduce an amount of heat generated by the flexible circuit 600. A layer of adhesive 614 extends below the insulation 612. The conductive pathway 604 is embedded within the layer of adhesive 614. Another layer of insulation 616 extends below the adhesive 614 and the conductive pathway 604.

A layer of uncured material 618 extends between the insulation 610 and the insulation 616. The uncured material 618 may include any reinforcement fibers or fabrics into which a pre-catalyzed resin system has been impregnated. The uncured material 618 may take the form of a weave or a uni-directional fiber. The uncured material 618 may be FR-4 graded by the National Electrical Manufactures Association and may be flame resistant.

The layer of uncured material 618 increases a distance 620 between the conductive pathways 602 and 604 to increase an impedance of and reduce a capacitance of the conductive pathways 602 and 604. The layer of uncured material 618 may be positioned at any location between the conductive pathways 602 and 604. In one embodiment, the flexible circuit 600 does not include the layers of insulation 610 and 616. The layer of uncured material 618 may be positioned directly between, and adjacent to, the conductive pathways 602 and 604. Alternatively, any number of layers may be positioned between the conductive pathways 602 and 604.

Increasing the impedance of the conductive pathways 602 and 604 reduces an amount of interference between the conductive pathways 602 and 604. The impedance is proportional to a distance 620 between the conductive pathways 602 and 604. Increasing a thickness 622 of the uncured material 618 increases the distance 620 between the conductive pathways 602 and 604. The thickness 622 of the uncured material 618 may be selected based on a required impedance of the conductive pathways 602 and 604. In an embodiment having a connector pad, another layer of uncured material may extend between the conductive pathway 604 and the connector pad to increase an impedance of the connector pad.

The embodiments described herein may increase an impedance of the electrical transmission paths within a flexible circuit. The addition of an uncured material to the flexible circuit may enable a distance between the electrical transmission paths to be increased while maintaining a flexibility and integrity of the flexible circuit. The uncured material may also provide a fire resistant material that improves and maintains a condition of the flexible circuit. The uncured material may also be cost-effective when used in a desired thickness.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A flexible circuit comprising:
   a circuit board mating end and a flexible body extending from the circuit board mating end;
   a conductive pathway extending through the flexible body to electrically couple circuit boards, the conductive pathway having an electrical contact;
   a layer of insulation on the conductive pathway;
   a connector pad positioned on the circuit board mating end, the electrical contact of the conductive pathway engages the connector pad, the connector pad configured to electrically couple the flexible circuit to one of the circuit boards; and
   a layer of uncured material on the layer of insulation, the layer of uncured material having a surface, the connector pad being provided on the surface of the layer of uncured material such that the layer of uncured material is between the connector pad and the conductive pathway, the layer of uncured material having a thickness selected to position the connector pad a distance from the conductive pathway to achieve a target impedance of the connector pad.

2. The flexible circuit of claim 1, wherein the layer of uncured material is formed from a flame resistant material.

3. The flexible circuit of claim 1, wherein the thickness of the layer of uncured material is increased to increase the impedance of the connector pad.

4. The flexible circuit of claim 1, wherein the layer of uncured material has a relative dielectric constant between 3.9 and 4.2.

5. The flexible circuit of claim 1 wherein the layer of insulation is deposited directly on the conductive pathway and the layer uncured material is deposited directly on the layer of insulation, the thickness of the layer of uncured material is selected based on a thickness and a dielectric constant of the layer of insulation coupled between the conductive pathway and the layer of uncured material.

6. The flexile circuit of claim 1 further comprising multiple conductive pathways, each of the conductive pathways separated by at least one of another layer of insulation and another layer of uncured material.

7. The flexible circuit of claim 6, wherein a thickness of the at least one of another layer of insulation and another layer of uncured material is selected to achieve a target impedance of each conductive pathway.

8. The flexible circuit of claim 1, further comprising a conductive via extending through the layer of insulation and the layer of uncured material, the conductive pathway being electrically connected to the conductive via, the connector pad being electrically connected to the conductive via.

9. A removable card connector assembly comprising:
   a circuit board;
   a connector coupled to the circuit board and configured to couple the assembly to another circuit board; and
   a flexible circuit to electrically join the circuit boards, the flexible circuit comprising:
      a circuit board mating end and a flexible body extending from the circuit board mating end;
      a conductive pathway extending through the flexible body to electrically couple the circuit boards, the conductive pathway having an electrical contact;
      a layer of insulation on the conductive pathway;
      a connector pad positioned on the circuit board mating end, an electrical contact of the conductive pathway engages the connector pad, the connector pad configured to electrically couple the flexible circuit to one of the circuit boards; and
      a layer of uncured material on the layer of insulation, the layer of uncured material having a surface, the connector pad being provided on the surface of the layer of uncured material such that the layer of uncured material is between the connector pad and the conductive pathway, the uncured material increasing a distance between the connector pad and the conductive pathway to position the connector pad a distance from the conductive pathway to achieve a target impedance.

10. The assembly of claim 9, wherein the layer of uncured material is FR-4 graded.

11. The assembly of claim 9 further comprising insulation coupled between the conductive pathway and the layer of uncured material.

12. The assembly of claim 9 wherein the layer of insulation is deposited directly on the conductive pathway and the layer of uncured material is deposited directly on the layer of insulation, a thickness of the layer of uncured material is selected based on a thickness and a dielectric constant of the layer of insulation coupled between the connector pad and the layer of uncured material to achieve the target impedance.

13. The assembly of claim 9 further comprising multiple conductive pathways separated by other layers of at least one of insulation and uncured material.

14. The assembly of claim 9, wherein the flexible circuit further comprises a second circuit board mating end positioned on an opposite end of the flexible body, the second circuit board mating end having a connector pad, the second circuit board mating end having a layer of uncured material positioned between the connector pad of the second circuit board and the conductive pathway.

15. The assembly of claim 14 wherein the second circuit board includes a layer of insulation coupled between the conductive pathway and layer of uncured material.

16. A flexible circuit comprising:
    circuit board mating ends and a flexible body extending between the circuit board mating ends, each of the circuit board mating ends configured to electrically couple to a circuit board;
    transmission paths extending through the flexible circuit to transmit signals between the circuit boards; and
    a layer of uncured material extending between the transmission paths, the uncured material increasing an impedance of the transmission paths.

17. The flexible circuit of claim 16, wherein the transmission paths and layer of uncured material are arranged on different layers at different depths of the flexible circuit, the flexible circuit further comprising insulation coupled between the transmission paths.

18. The flexible circuit of claim 16, wherein a thickness of the layer of uncured material is controlled to achieve a target impedance of the transmission paths.

19. The flexible circuit of claim 16, wherein the layer of uncured material is FR-4 graded.

20. The flexible circuit of claim 16 further comprising insulation coupled between each transmission path and the layer of uncured material.

* * * * *